(12) United States Patent
Farquhar et al.

(10) Patent No.: US 6,589,639 B2
(45) Date of Patent: Jul. 8, 2003

(54) HOLE FILL COMPOSITION AND METHOD FOR FILLING HOLES IN A SUBSTRATE

(75) Inventors: Donald S. Farquhar, Endicott, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 09/863,961

(22) Filed: May 23, 2001

(65) Prior Publication Data

US 2002/0187316 A1 Dec. 12, 2002

(51) Int. Cl.[7] .................................................. B32B 3/00
(52) U.S. Cl. ........................ 428/209; 428/901; 174/257; 174/258; 174/246
(58) Field of Search ................................ 428/209, 901; 174/257, 258, 246

(56) References Cited

U.S. PATENT DOCUMENTS

| | | | |
|---|---|---|---|
| 3,934,334 A | | 1/1976 | Hanni ........................ 29/625 |
| 4,107,837 A | | 8/1978 | Chang ........................ 29/625 |
| 4,145,460 A | | 3/1979 | Finley et al. .................. 427/97 |
| 4,188,415 A | | 2/1980 | Takahashi et al. ............. 427/97 |
| 4,221,925 A | | 9/1980 | Finley et al. ............... 174/68.5 |
| 4,303,715 A | | 12/1981 | Chang ........................ 428/137 |
| 4,791,248 A | * | 12/1988 | Oldenettel .................. 174/68.5 |
| 5,506,049 A | * | 4/1996 | Swei et al. .................. 428/323 |
| 5,571,593 A | * | 11/1996 | Arldt et al. .................. 428/131 |
| 5,922,453 A | * | 7/1999 | Horn, III et al. ............ 428/325 |

* cited by examiner

Primary Examiner—Deborah Jones
Assistant Examiner—Ling Xu
(74) Attorney, Agent, or Firm—James A. Lucas; Driggs, Lucas, Brubaker & Hogg Co., LPA

(57) ABSTRACT

A composition usable in hole filling of a metal layer and to planarize the metal layer is provided. The metal layer is part of a substrate which can be part of a multilayer printed circuit board or chip carrier. The composition comprises a fluoropolymer dielectric metal, a filler material, and a coupling agent, the filler material having at least a partial coating of the coupling agent thereon.

25 Claims, 2 Drawing Sheets

HOLE FILL COMPOSITION AND METHOD FOR FILLING HOLES IN A SUBSTRATE

FIELD OF THE INVENTION

This invention relates to a composition for filling holes in a substrate wherein the substrate can be part of a multi-layer printed circuit board or chip carrier. Specifically this invention defines a new and unique hole fill composition and method of filling such holes in a substrate which provides a substantially planar substrate surface at the filled hole locations wherein the filled hole substrate can form part of the completed multi-layer printed circuit board or chip carrier.

BACKGROUND OF THE INVENTION

Many known current printed circuit board constructions require one or more external conductive layers, e.g., circuitry and/or pads for mounting components thereon, and, given today's increased functional demands, a plurality of internal conductive planes, e.g., signal, power and/or ground. To provide effective interconnections between such surface components and the board's conductive circuitry, internal planes and/or pads, the use of conductive through holes has been adopted wherein several such holes are formed in the board and electrically coupled in a selective manner to internal and external conductive elements. Such holes typically include a conductive, e.g., copper, layer as part thereof which in turn contacts the also typically copper circuitry, pads and/or internal planes.

The term "through hole" or simply "hole" as used herein is meant to include both conductive and non-conductive apertures which may extend entirely through the circuit board or even only partly therethrough (such partial holes are often also called "vias" in the circuit board field), including between only one or more internal layers without being externally exposed. Examples of various circuit board structures which include holes of these types are defined in several published documents, including the following U.S. Letters Patents, issued on the dates identified:

| U.S. Pat. No. | Inventors | Filing Date |
|---|---|---|
| 4,704,791 | Chellis et al. | Nov. 10, 1987 |
| 4,435,480 | Hart et al. | Dec. 23, 1993 |
| 5,450,290 | Boyko et al. | Sep. 12, 1995 |
| 5,487,218 | Bhatt et al. | Jan. 30, 1996 |
| 5,557,844 | Bhatt et al. | Sep. 24, 1996 |
| 5,571,593 | Arldt et al. | Nov. 5, 1996 |
| 5,662,987 | Mizumoto et al. | Sep. 2, 1997 |

All of these patents are assigned to the same assignee as the present invention and are incorporated herein by reference.

Printed circuit boards of all the above type are particularly adapted for having one or more (usually several) electrical components, e.g., semiconductor chips, capacitors, resistors, etc., mounted on an external surface thereof and coupled to various, selected internal conductive planes within the board's dielectric substrate. As demands for increased levels of integration in semiconductor chips and other electrical components continue, parallel demands call for concurrent increased functional capabilities, e.g., increased circuit densities, in printed circuit boards adapted for use with such components. Such demands further emphasize the growing need for more closely spaced electrical components on the board's outer surfaces. For those boards possessing greater functional capabilities and therefore which use several through holes therein, it is highly desirable to position the electrical components directly over the holes to maximize board real estate while assuring a compact, miniaturized final board product.

Increased demands such as those above are particularly significant when it is desirable to couple what are referred to as ball grid array (BGA) or similar components directly onto the board's outer conductive layer(s). These components typically include a semiconductor chip electrically coupled to a plurality of highly dense conductors, e.g., solder ball elements, closely positioned in a fixed pattern on the component's undersurface. This is also the case for directly mounted semiconductor chips (also known in this technology as direct chip attach (or DCA) components) wherein a dense pattern of several minute solder balls are arranged on the chip's small undersurface (that directly facing the underlying circuit board). In this case, the circuit board may also be referred to as a chip carrier.

In many of today's advanced chip carriers, the basic building block of the chip carrier is a metal ground plane that has been etched to form a personalized ground plane having clearance holes. The personalized ground plane can then be laminated on both sides with a fluoropolymer or other dielectric material and a metal foil, preferably copper foil. The metal foil is then circuitized to form a signal carrying layer. This circuitized structure may be defined as a signal core. Subsequent additions of fluoropolymer or other dielectric layers and metal foil layers are "built up" on the signal core and can form power and additional signals layers which are ultimately built up to a multilayer chip carrier structure. The presence of clearance holes in a signal core may lead to a non-planar signal core outside surface which can affect the planarity of subsequent layers "built up" on the signal core (and ultimately the planarity of the surface of the multilayer chip carrier on which the semiconductor chip is to be mounted.) This is believed to be caused by the limited flow characteristics of the fluoropolymer or other dielectric material during the lamination phase of signal core manufacture.

It is believed that a new hole fill composition and a method of making a substrate having at least one hole (and possibly several) therein which is filled with the new hole fill composition will substantially prevent non-planarity of the signal core outside surface and lead to a substantially planar multilayer printed circuit board or chip carrier surface when the signal core is used in the manufacture of the multilayer printed circuit board or chip carrier. This would represent a significant advancement in the art.

SUMMARY OF THE INVENTION

Accordingly, it is the object of this invention to provide a new and unique composition which in turn may be used as a hole fill in a metal layer of a substrate.

Another object of this invention is to provide a method of making such a composition.

Yet another object of this invention is to provide a substrate including a metal layer having at least one through hole therein and a mixture of a fluoropolymer dielectric material and a filler material substantially filling the through hole. The mixture will provide a substantially planar filled hole substrate and will improve the planarity of the multi-layer printed circuit board or chip carrier of which the substrate is a part.

Still yet another object of the invention is to provide a method of making such a substrate.

The invention is adaptable to mass production and reduces the defect level and lowers the cost of product made with this invention.

According to one aspect of the invention, there is provided a hole fill composition comprising a fluoropolymer dielectric material, a filler material, and a coupling agent, the filler material having at least a partial coating of the coupling agent thereon.

According to another aspect of the invention, there is provided a hole fill composition comprising a fluoropolymer dielectric material, a surfactant, a filler material, and a coupling agent, the filler material having at least a partial coating of the coupling agent thereon.

According to yet another aspect of the invention, there is provided a hole fill composition comprising a fluoropolymer dielectric material, a silica filler material, and a coupling agent, the filler material having at least a partial coating of the coupling agent thereon.

According to still yet another aspect of the invention, there is provided a hole fill composition comprising a fluoropolymer dielectric material, a surfactant, a silica filler material, and a coupling agent, the filler material having at least a partial coating of the coupling agent thereon.

According to another aspect of the invention, there is provided a hole fill composition comprising a fluoropolymer dielectric material, a filler material, and a fluorosilane coupling agent, the filler material having at least a partial coating of the coupling agent thereon.

According to yet another aspect of the invention, there is provided a hole fill composition comprising a fluoropolymer dielectric material, a surfactant, a filler material, and a fluorosilane coupling agent, the filler material having at least a partial coating of the coupling agent thereon.

According to still yet another aspect of the invention, there is provided a method of making a hole fill composition comprising the steps of providing a quantity of a filler material, adding to the quantity of the filler material a quantity of coupling agent to at least partially coat the filler material, adding to the quantity of filler material at least partially coated with the coupling agent a quantity of a fluoropolymer dielectric material, and blending the filler material coated with the coupling agent and the fluoropolymer material.

According to another aspect of the invention, there is provided a method of making a hole fill composition comprising the steps of providing a quantity of a filler material, dissolving a quantity of coupling agent in a first solvent to form a solution, mixing the filler material into the solution to at least partially coat the filler material, drying the filler material at least partially coated with the coupling agent, adding the filler material at least partially coated with the coupling agent to a second solvent, adjusting the pH of the second solvent, dispersing a quantity of a fluoropolymer dielectric material into the second solvent, adding a quantity of a surfactant to the second solvent, and blending the filler material at least partially coated with the coupling agent and the fluoropolymer material.

According to yet another aspect of the invention, there is provided a substrate comprising a metal layer including at least one through hole therein defined by at least one side wall within the metal layer, and a mixture of a fluoropolymer dielectric material and a filler material at least partially coated with a coupling agent positioned on the side wall of the through hole, the mixture substantially filling the through hole in the metal layer.

According to still yet another aspect of the invention, there is provided a substrate comprising a metal layer including at least one through hole therein defined by at least one side wall within the metal layer, and a mixture of a fluoropolymer dielectric material and a silica filler material at least partially coated with a coupling agent positioned on the side wall of the through hole, the mixture substantially filling the through hole in the metal layer.

According to another aspect of the invention, there is provided a substrate comprising a metal layer including at least one through hole therein defined by at least one side wall within the metal layer, and a mixture of a fluoropolymer dielectric material and a filler material at least partially coated with a fluorosilane coupling agent positioned on the side wall of the through hole, the mixture substantially filling the through hole in the metal layer.

According to yet another aspect of the invention, there is provided a method of making a substrate comprising the steps of providing a metal layer including at least one through hole therein defined by at least one side wall within the metal layer, positioning a mixture of a fluoropolymer dielectric material and a filler material at least partially coated with a coupling agent on the side wall of the through hole, and heating the metal layer, the fluoropolymer dielectric material and the filler material at least partially coated with the coupling agent to adhere the dielectric material and the filler material to the side wall, the dielectric material and the filler material substantially filling the through hole.

BEST MODE FOR CARRYING OUT THE INVENTION

In accordance with the teachings of this invention, there is provided a new composition for use as a hole fill in the manufacture of a substrate usable as part of a multilayer printed circuit board or chip carrier. In one embodiment, this hole fill composition comprises a fluoropolymer dielectric material, a filler material, and a coupling agent at least partially coating the filler material. A fluoropolymer is defined as a carbon based organic polymer with fluorine atoms replacing at least some of the hydrogen atoms covalently bound to the carbon atoms that form the basic chemical structure. It has been discovered that when the hole fill composition is utilized to fill through holes in a metal layer during the manufacture of a substrate, it results in a planar substrate surface.

Figure 1:
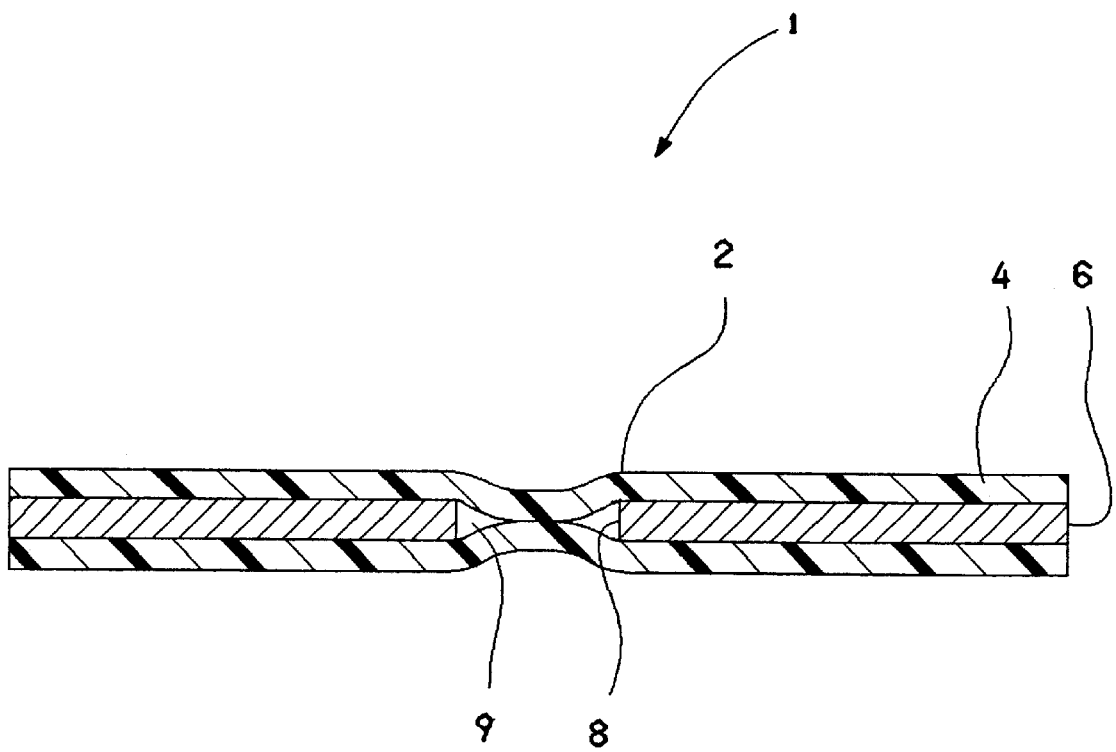
FIG. 1 is a much-enlarged sectional view in elevation of a substrate in accordance with the prior art.

Referring to FIG. 1, a known substrate 1 is shown. A non-planar substrate surface 2 can result when a fluoropolymer or similar dielectric layer 4 used in the manufacture of a multilayer printed circuit board or chip carrier is laminated to a metal layer 6 having through holes 8 (only one shown in FIG. 1). A non-planar substrate surface used in the manufacture of a multilayer printed circuit board or chip carrier can result in a non-planar multilayer printed circuit board or chip carrier outer surface of which the substrate is a part. A non-planar board or chip carrier outer surface can adversely affect assembly of components, such as semiconductor chips, to the multilayer printed circuit board or chip carrier surface and can result in increased assembly defect levels and additional manufacturing costs.

A blistering defect between laminated dielectric layer 4 and metal layer 6 of the substrate can occur during processing of the multilayer printed circuit board or chip carrier due to voids being present, after lamination, in the through hole locations. These voids can occur because the properties of the dielectric material may not allow substantial uniform filling of the through holes in the metal layer during lamination.

The current hole fill composition substantially fills the through holes in the metal layer of the substrate, provides a substantially planar substrate surface, and minimizes voids and blisters in the through hole area, thereby reducing defect levels during manufacture or assembly of components to the multilayer printed circuit board or chip carrier of which the substrate is a part.

The fluoropolymer dielectric material of this invention is selected from the group consisting of polytetrafluoroethylene and its polymers, copolymers of tetrafluorothylene, hexafluoropropylene, copolymers of tetrafluoroethylene, perfluoro-2-2-dimethyl-1,3 dioxide, polytrifluorochloroethylene, copolymers of trifluoromonochloroethylene, polymers of perfluoroalkyl vinyl ether, perfluorinated ethylene-propylene copolymers, copolymer of tetrafluoroethylene and perfluoroalkoxy, copolymer of tetrafluoro-ethylene and ethylene, copolymer of chlorotrifluoroethylene and ethylene, polymers of chlorotrifluorethylene, polymers of chlorotrifluoroethylene, and copolymer of tetrafluoroethylene and at least 65 mole % of perfluoro-2,2-dimethyl-1,3-di-oxide.

The fluoropolymer dielectric material comprises about 40 percent by weight to about 90 percent by weight of the composition. Some examples of commercially available fluoropolymer dielectric materials that are operable in this invention are TEFLON PTFE, TEFLON FEP, TEFLON PFA, TEFZEL, HFB-430 and TEFLON AF (all trademarks of E. I. Dupont de Nemours and Co., Wilmington, Del.), HALAR (a trademark of Ausimont USA, Inc, Thorofare, N.J.), and Neoflon (a trade mark of CTFE produced by Darkin, Orangeburg, N.Y.).

The filler material that can be employed pursuant to the present invention comprises silica. The filler material comprises about 9 percent by weight to about 60 percent by weight of the composition. The silica, having the chemical formula $SiO_2$, can be selected from the group consisting of crystalline silica, fumed silica, synthetic silica, precipitated silica and amorphous silica. Crystalline silica and amorphous silica are obtained/mined (ground and purified) from natural sources. Purification removes other elements and ionic impurities. The purification step involves both thermal and chemical processes. Synthetic silica and precipitated silica can be obtained from sol (colloidal)/gel chemical processing of silanes, which involves the polymerization of silanes into small insoluble silica particles. Such a reaction permits the preparation of highly pure silica (without natural mineral impurities) having controlled size and shape. Fumed silica is a synthetic silica prepared from the reaction of $SiCl_4$, hydrogen, and oxygen in the gas phase to form $SiO_2$. The silica particles can have substantially spherical or spheroidal shapes and have sizes of from about 0.1 microns to about 40 microns. The addition of silica particles of this shape and size facilitates the composition such that it will readily flow into and conform to the through hole shape of the metal layer and provides low thermal expansion properties, a very important aspect of this invention.

A portion of each of the filler particles can include a layer of a coupling agent positioned thereon to improve adhesion and moisture resistance. Coupling agents such as fluorosilanes including alkoxy or halo groups can be used in this invention. Fluorosilane and alkoxy and halo fluorosilanes, take the form of (R')————Si————(R", R'", R""). Silanes are organic based silicon containing molecules. Typically the Si group is bound to an organic functional group (R') such as alkane, alkene, phenyl or aromatic groups or combinations thereof and may have fluoro, bromo, or chloro (halo) groups replacing the hydrogen atoms. The R' group may also have a chemically active pendant group, such as an epoxy, amino, chloro, bromo, enabling it to react with other organic molecules. The other three groups (R", R'", R"") attached to the Si are typically chloro, bromo, methoxy, or ethoxy and can react with each other in a displacement reaction to form a monolayer on a silica or metal surface or together to form a network polymer. For example, coupling agents, such as 1H, 1H, 2H, 2H perflurooctyltriethoxysilane #12303-4 and 1H, 1H, 2H, 2H perfluroalkyltriethoxysilane #12347-1, both available from PCR Incorporated, Gainesville, Fla., can be used in this invention. An amount of coupling agent which is from about 1% by weight to about 10% by weight of the composition has been found satisfactory. The thickness of the coupling agent on the filler particles can be as little as about a few monolayers.

Surfactants can be used to facilitate mixing of the filler material with the fluoropolymer dielectric in solution. Suitable surfactants include those of the non-ionic type, available under the product name Triton X-100 from Rohm and Haas Co., Philadelphia, Pa. Other surface active agents that can be used in this invention include polyoxyethylene/polyoxypropylene block copolymers commercially available under the trade name Pluronics, such as Pluronic L-62, Pluronic 31R1, and Pluronic L-92 from BASF Inc., Parsippany, N.J.

The compositions of the present invention may have a pH of from about 8 to about 11.

In accordance with another embodiment of this invention, a method for making the hole fill composition defined above is hereby provided. The method comprises the steps of providing a quantity of filler material as defined hereinabove, adding to the quantity of filler material a quantity of the above-defined coupling agent to at least partially coat the filler material, adding to the quantity of filler material at least partially coated with the coupling agent a quantity of the fluoropolymer dielectric material of the type defined above, and then blending the filler material coated with the coupling agent and the fluoropolmer dielectric material. The filler material at least partially coated with the coupling agent can be prepared by dissolving the coupling agent in a suitable solvent, such as isopropyl alcohol, and mixing the filler material into the coupling agent/solvent solution to form a slurry. The slurry can then be poured into an open vessel, air dried for about 12 hours, broken up into smaller particles, and further dried in an air oven at about 125° C. for about another 2 hours. The step of blending the filler material at least partially coated with coupling agent and the fluoropolymer dielectric material can include slowly adding the dried filler material into a solvent, such as deionized water, with vigorous agitation to form a slurry, adjusting the pH of the deionized water/filler material slurry to a pH of from about 8 to a pH of about 11 using ammonium hydroxide or another suitable base, and dispensing the fluoropolymer dielectric material into the pH adjusted deionized water/filler material slurry. A quantity of surfactant, such as defined above, can be added with stirring until the surfactant is dissolved.

Figure 2:
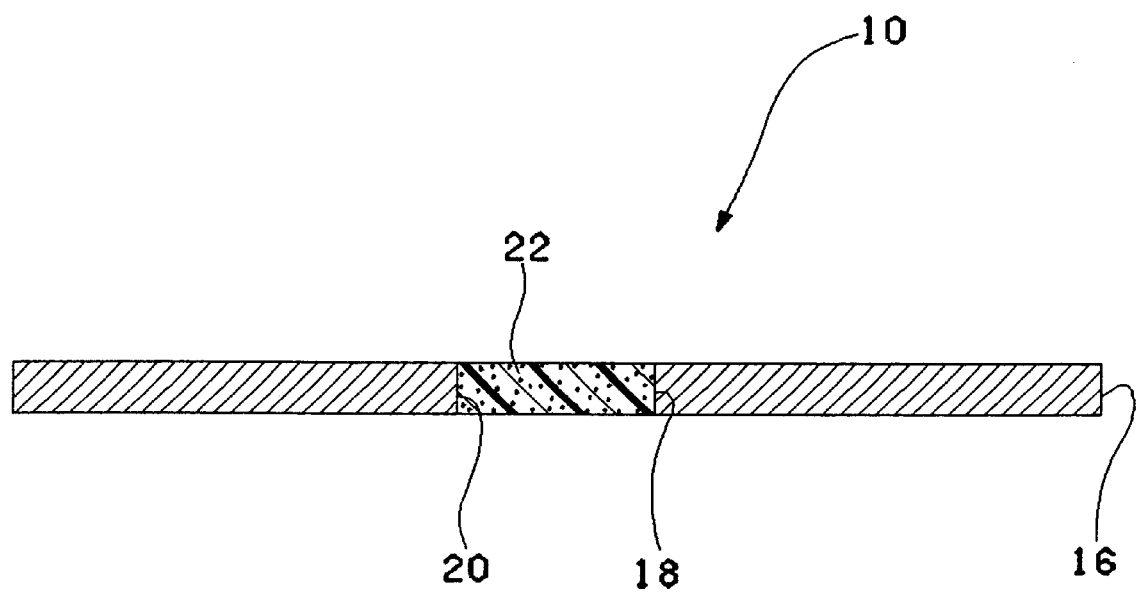
FIG. 2 is a much-enlarged sectional view in elevation of one embodiment of the substrate of the present invention, illustrating the substrate having a metal layer including at least one through hole therein, and a mixture of a fluoropolymer dielectric material and a filler material at least partially coated with a coupling agent substantially filling the through hole.

In accordance with yet another embodiment of this invention, referring to FIG. 2, there is also provided a substrate 10 which includes a metal layer 16 including at least one through hole 18 therein defined by at least one side wall 20 within the metal layer, and a mixture 22 of the above-identified fluoropolymer dielectric material and the above-defined filler material at least partially coated with a coupling agent, as described above, positioned on the side wall of the through hole, the mixture substantially filling the through hole in the metal layer. The metal layer 16 of substrate 10 is selected from the group consisting of nickel, copper, cobalt, molybdenum, iron and alloys thereof. For example, one alloy that can be used as the metal layer of this invention is Invar clad with a layer of copper. Invar can be defined as an alloy having a composition of about 34% to about 38% nickel and about 62% to about 66% iron. A suitable alloy of this type is available from Texas Instruments Incorporated (Attleboro, Mass.).

In accordance with still yet another embodiment of this invention, a method for making the substrate defined above is hereby provided. The method comprises the steps of providing a metal layer including at least one through hole therein defined by at least one side wall within the metal layer, as defined hereinabove, positioning a mixture of the above-defined fluoropolymer dielectric material and a filler material of the type defined above at least partially coated with the above-defined coupling agent on the side wall of the through hole, and heating the metal layer, fluoropolymer dielectric material, and filler material to a temperature of up to about 80 degrees centigrade above the fluoropolymer melting temperature to adhere the dielectric material and filler material to the side wall of the through hole, the dielectric material and the filler material substantially filling the through hole. This will form a substantially planar substrate surface. During the heating step, the surfactant employed in the production of the fill composition is substantially burned off. For example, when the fluoropolymer dielectric material is TEFLON PTFE, its melting temperature is about 327 degrees centigrade, so the heating temperature would be in the range of about 327 degrees centigrade to about 407 degrees centigrade.

The through hole in the metal layer can be provided by the step of drilling, punching or etching.

The filler material and the fluoropolymer dielectric material are adhered to the side wall of the through hole by fusion during the heating step. Fusion is the process by which the fluoropolymer dielectric material and the filler material are heated above the fluoropolymer melt temperature so that the fluoropolymer and filler adhere to the side wall by a combination of mechanical and chemical interlocking once the temperature is reduced below the melt temperature.

The invention provides a novel hole fill composition and method of making the composition which can substantially fill through holes in the metal layer of a substrate, provides a substantially planar substrate surface, and minimizes voids and blisters in the through hole area, thereby reducing defect levels during manufacture or assembly of components to the multilayer printed circuit board or chip carrier of which the substrate is a part.

While there have been shown and described what are the present considered preferred embodiments of the invention, it will be obvious to those skilled in the art that various changes and modifications may be made therein without departing from the scope of the invention as defined by the appended claims.

We claim:

1. A substrate comprising:
   a metal layer including at least one through hole therein defined by at least one side wall within said metal layer; and
   a mixture of a fluoropolymer dielectric material and a filler material at least partially coated with a coupling agent positioned on said side wall of said through hole, said mixture substantially filling said through hole in said metal layer.

2. The substrate of claim 1 wherein said fluoropolymer dielectric material is selected from the group consisting of polymers of tetrafluoroethylene and its copolymers including tetrafluoroethylene and perfluoroalkoxy, tetrafluoroethylene and ethylene, and tetrafluoroethylene and at least 65 mole % of perfluoro-2,2-dimethyl-1,3-di-oxide; hexafluoropropylene; perfluoro-2-2-dimethyl-1,3 dioxide; polymers and copolymers of trifluorochloroethylene including trifluorochloroethylene and ethylene; polymers of perfluoroalkyl vinyl ether; and perfluorinated ethylene-propylene copolymers.

3. The substrate of claim 1 wherein said metal layer is selected from the group consisting of nickel, copper, cobalt, molybdenum, iron and alloys thereof.

4. The substrate of claim 3 wherein said metal layer comprises copper-Invar-copper.

5. The substrate of claim 1 wherein said fluoropolymer dielectric material comprises about 40 percent by weight to about 90 percent by weight of said mixture.

6. The substrate of claim 1 wherein said filler material comprises about 9 percent by weight to about 60 percent by weight of said mixture.

7. The substrate of claim 1 wherein said coupling agent comprises about 1 percent by weight to about 10 percent by weight of said mixture.

8. A substrate comprising:
   a metal layer including at least one through hole therein defined by at least one side wall within said metal layer; and
   a mixture of a fluoropolymer dielectric material and a silica filler material at least partially coated with a coupling agent positioned on said side wall of said through hole, said mixture substantially filling said through hole in said metal layer.

9. The substrate of claim 8 wherein said fluoropolymer dielectric material is selected from the group consisting of polymers of tetrafluoroethylene and its copolymers including tetrafluoroethylene and perfluoroalkoxy, tetrafluoroethylene and ethylene, and tetrafluoroethylene and at least 65 mole % of perfluoro-2,2-dimethyl-1,3-di-oxide; hexafluoropropylene; perfluoro-2-2-dimethyl-1,3 dioxide; polymers and copolymers of trifluorochloroethylene including trifluorochloroethylene and ethylene; polymers of perfluoroalkyl vinyl ether; and perfluorinated ethylene-propylene copolymers.

10. The substrate of claim 8 wherein said metal layer is selected from the group consisting of nickel, copper, cobalt, molybdenum, iron and alloys thereof.

11. The substrate of claim 10 wherein said metal layer comprises copper-Invar-copper.

12. The substrate of claim 8 wherein said fluoropolymer dielectric material comprises about 40 percent by weight to about 90 percent by weight of said mixture.

13. The substrate of claim 8 wherein said silica of said silica filler is selected from the group consisting of crystalline silica, fumed silica, synthetic silica, precipitated silica, and amorphous silica.

14. The substrate of claim 8 wherein said silica filler material comprises about 9 percent by weight to about 60 percent by weight of said mixture.

15. The substrate of claim 8 wherein said silica of said silica filler material is comprised of particles, each particle having a size of from about 0.1 micron to about 40 microns.

16. The substrate of claim 15 wherein said particles of silica are substantially spherical or spheroidal.

17. The substrate of claim 8 wherein said coupling agent comprises about 1 percent by weight to about 10 percent by weight of said mixture.

18. A substrate comprising:
- a metal layer including at least one through hole therein defined by at least one side wall within said metal layer; and
- a mixture of a fluoropolymer dielectric material and a filler material at least partially coated with a fluorosilane coupling agent positioned on said side wall of said through hole, said mixture substantially filling said through hole in said metal layer.

19. The substrate of claim 18 wherein said fluoropolymer dielectric material is selected from the group consisting of polymers of tetrafluoroethylene and its copolymers including tetrafluoroethylene and perfluoroalkoxy, etrafluoroethylene and ethylene, and tetrafluoroethylene and at least 65 mole % of perfluoro-2,2-dimethyl-1,3-di-oxide; hexafluoropropylene; perfluoro-2-2-dimethyl-1,3 dioxide; polymers and copolymers of trifluorochloroethylene including trifluorochloroethylene and ethylene; polymers of perfluoroalkyl vinyl ether; and perfluorinated ethylene-propylene copolymers.

20. The substrate of claim 18 wherein said metal layer is selected from the group consisting of nickel, copper, cobalt, molybdenum, iron and alloys thereof.

21. The substrate of claim 20 wherein said metal layer comprises copper-Invar-copper.

22. The substrate of claim 18 wherein said fluoropolymer dielectric material comprises about 40% by weight to about 90% by weight of said mixture.

23. The substrate of claim 18 wherein said filler material comprises about 9 percent by weight to about 60 percent by weight of said mixture.

24. The substrate of claim 18 wherein said fluorosilane coupling agent includes alkoxy or halo groups attached to an Si group.

25. The substrate of claim 24 wherein said fluorosiliane coupling agent comprises about 1 percent by weight to about 10 percent by weight of said mixture.

* * * * *